Feb. 27, 1951 E. P. THIAS 2,543,560

MEANS FOR VARYING THE INDUCTIVE REACTANCE OF ELECTRICAL CIRCUITS

Filed May 11, 1950 2 Sheets-Sheet 1

EDWIN P. THIAS,
INVENTOR.

HUEBNER, BEEHLER, WORREL
HERZIG and CALDWELL.
ATTORNEYS.
By [signature]

EDWIN P. THIAS,
INVENTOR.
HUEBNER, BEEHLER, WORREL,
HERZIG and CALDWELL,
ATTORNEYS.
By Conrad C. Caldwell Patented Feb. 27, 1951

2,543,560

UNITED STATES PATENT OFFICE 2,543,560

MEANS FOR VARYING THE INDUCTIVE REACTANCE OF ELECTRICAL CIRCUITS

Edwin P. Thias, Los Angeles, Calif., assignor to Standard Coil Products Co., Inc., Chicago, Ill., a corporation of Illinois Application May 11, 1950, Serial No. 161,288

12 Claims. (Cl. 171—777)

My invention relates in general to a means for varying the frequency response of high frequency circuits, and has particular reference and adaptability to a rotary type tuner or channel selector for television apparatus.

In order to render high frequency circuits resonant to certain frequency bands or channels in the case of television, it is necessary to vary either the capacitance or inductance, or both, in a given circuit.

Standard television broadcasting and receiving is accomplished at a frequency high enough that the variance of the inductance becomes relatively simple by changing the length of the path through which the current must flow in a given circuit. It is therefore one of the objects of my invention to produce a rotary type tuner or channel selector for use in television, which is adapted to vary the length, and therefore the inductance of a given circuit for the purpose of rendering said circuit resonant in the desired channel or wave length band.

As is well known, television transmission has been divided into twelve bands numbered 2 to 13, inclusive, channel 13 being the highest frequency. Channels 13 to 7, inclusive, are separated by approximately four to six megacycles. Channels 6 to 12, inclusive, are separated by from five to seven megacycles. However, channels 6 and 7 are separated by approximately 75 megacycles. It therefore becomes necessary in the design and production of a suitable tuner which depends upon inductance variance, to include a relatively large inductance which must be inserted between channels 6 and 7.

It is a further object of my invention to provide a simplified channel selector which can be produced readily by mass production methods relatively inexpensively, and which can be reproduced with a relatively high degree of accuracy.

In selecting the various channels for television transmission and reception, it is necessary to simultaneously tune or render resonant, such circuits as the antenna, radio frequency plate, converter grid and oscillator circuits.

It is also one of the objects of my invention to provide a simplified television tuner adapted to simultaneously tune the required circuits, and which can be readily assembled or ganged by unskilled labor, into an accurate, single control television tuner.

Other and further objects and advantages will become apparent from the drawings and the specifications relative thereto.

Figure 8:
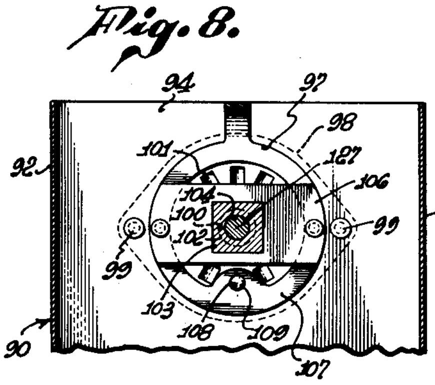
Figure 9:
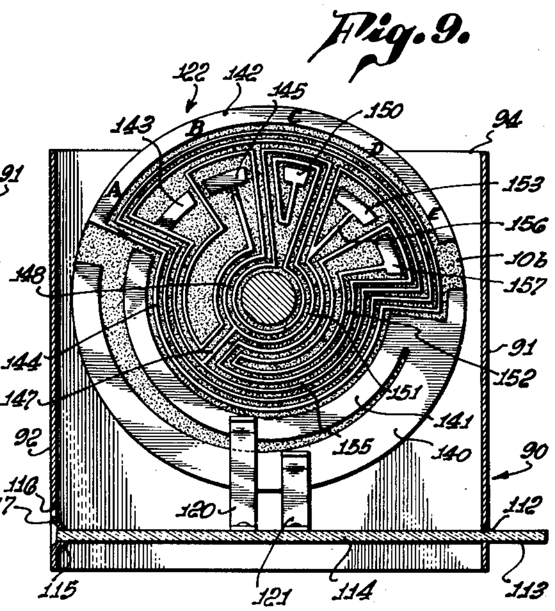
Figure 10:
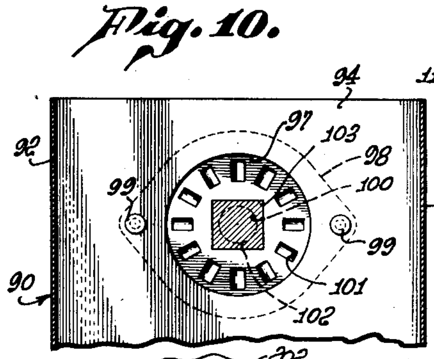

Figures 8, 9 and 10 are sectional views taken on lines 8—8, 9—9, and 10—10, respectively.

Figure 11:
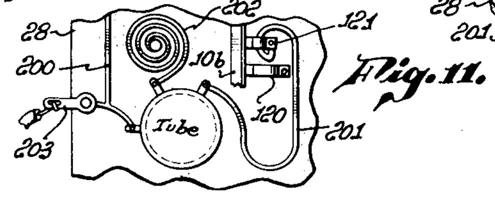

Figure 11 is a fragmentary plan view of the dielectric plate mounting for the contact elements.

Figure 12:
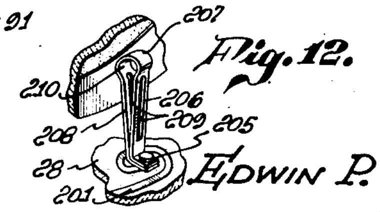

Figure 12 is a perspective view of a modified form of contact element for engaging a disc.

Figure 1:
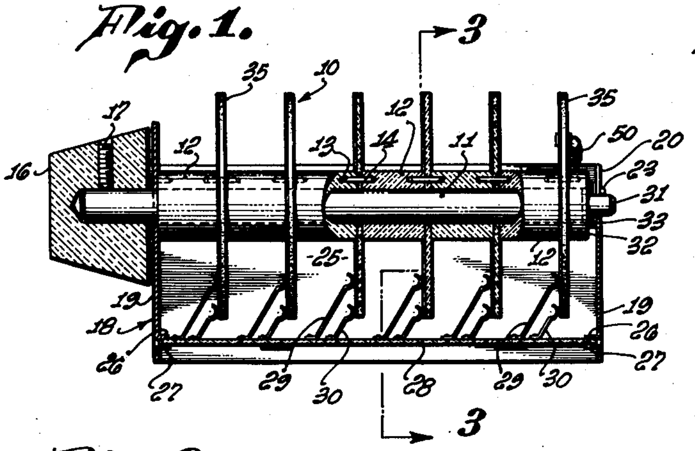
Figure 1 is a side sectional elevation of one example of a television tuner embodying the principles of my invention.
Figure 4:
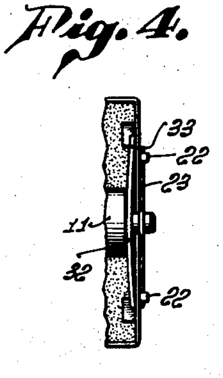
Figure 4 is a fragmentary top plan view of the right-hand end of the tuner illustrated in Figure 1.

The television tuner shown in Figure 1, comprises in general, a plurality of tuning elements designated generally 10, which are discs coaxially mounted on a shaft 11 having spacers 12 interposed therebetween. The spacers 12 are formed with axially parallel bores 13 and are adapted to receive alignment pins 14. It will be readily apparent that each of the spacers 12 may be formed with an outwardly projecting pin integral therewith in lieu of the separate pin 14, the purpose being to align the discs 10 properly for the assembly as shown.

A tuning knob 16 is secured to one end of the shaft 11 by means of a set screw 17 and is used for rotating the assembly.

Figures 2, 3, 5:
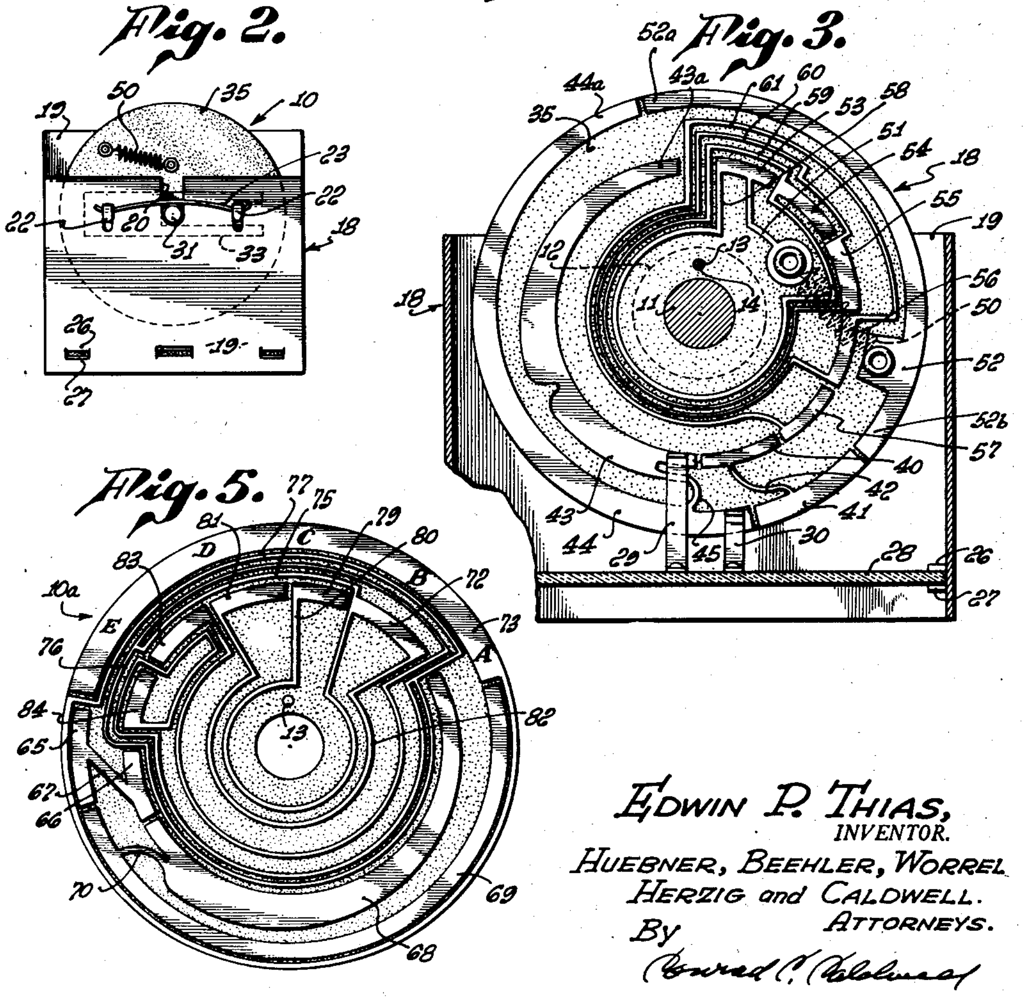
Figure 2 is an end view of the tuner illustrated in Figure 1, taken from the right-hand end.
Figure 3 is an enlarged sectional view taken on the line 3—3 of Figure 1.
Figure 5 is a view of a modified form of tuning element such as that shown in Figure 3.

The shaft 11, together with the ganged assembly of the discs 10, are mounted in a box-like structure designated generally 18 in Figure 2, having ends 19. The ends 19 are formed with slots 20 into which opposite ends of the shaft 11 are disposed.

The ends 19 are lanced and ears 22 formed to project outwardly. A spring 23 is disposed with its ends under the ears 22 and its center over the shaft 11 to hold the assembly in place in the box 18.

The ends 19 and side walls 25 are pierced to form inwardly projecting ears 26 and 27 which said ears are adapted to retain and support a plate 28. The plate 28 is preferably dielectric as will become readily apparent. Contact fingers 29 and 30 are secured to the plate 28 and are connected to the circuit or circuits to be tuned by any desirable method, a preferred form being shown in Figure 11 and next described.

Referring to Figure 11 which shows a fragmentary plan of the dielectric plate 28, it is preferable to employ metallic surfaces 200, 201, 202 etc. defining conductive paths on the dielectric plate. A conventional riveted connector 203 is riveted through the plate in direct contact with part of the metallic surface 200. Branches of this surface or conductive path 200 lead to various component parts of the television receiver. The conductive paths may be formed on the dielectric plate by the same process that is subsequently described in connection with discs 10 and 10*b*. The showing in Figure 11 is illustrative only and does not comprise a complete circuit, nor is the particular configuration of the conductive paths essential. The main thing is to utilize the feature of the metallic deposit on the dielectric plate as the conductors.

Because the deposit is relatively thin and in order not to confuse the remaining figures of the drawings, these conductive paths are not shown in the sectional views.

The shaft 11 is formed with a reduced end 31 to thereby define a shoulder 32. A resilient member 33 in the form of a leaf spring is disposed between the end 19 and the shoulder 32 to urge the assembly shown in Figure 1 to the left to thereby maintain a proper resilient contact between the fingers 29 and 30 and the circuit on the tuning elements to be described.

As will be seen in Figure 3, the tuning elements 10 comprise a disc-like dielectric plate 35 having a plurality of conductive surfaces thereon to define the tuning circuits. As was previously pointed out in high frequency circuits, the length of the path through which the current must flow determines the inductance of that circuit. Due to the nature of such circuits and the inductance characteristics of electrical paths, it is desirable to have a relatively short conductive path in the band, commonly known as channel 13, and to progressively increase the length of that path as the tuner approaches channel 2.

In the tuning element 10 I have provided a pair of concentric sets of contact segments against which the contact fingers 29 and 30 are resiliently urged. In explaining the circuit employed, reference will first be made to the location and path for channel 13. This path comprises an inner contact segment 40 and an outer contact segment 41 having a conductive path 42 interconnecting the two contact segments.

As the tuning element 10 is rotated counter-clockwise in Figure 3, the contact points 29 and 30 contact the segments 43 and 44 which are interconnected by a continuous path 45. The path of travel of the current is slightly longer between the contact points 29 and 30 in this position than in the position of channel 13. The position as illustrated in Figure 3 shows the tuner on channel 12.

As the tuning element 10 is rotated counter-clockwise, the contact points 29 and 30 slide along the segments 43 and 44, so that the path of travel of the current is progressively increased up to the ends 43*a* and 44*a*. During the travel from the position as shown to the points 43*a* and 44*a*, the television tuner progressively selects from channel 12 to channel 7.

It will be noted that the contact segment 43 gradually increases in width to the central portion where it is notched, and then decreases in width to the point 43*a*. Such configuration is desirable in that the desired length of path is obtained thereby and the inductance of the circuit is also effected by the spacing between the segments 43 and 44.

During the selection of channels between channel 13 and channel 7, a relatively uniform change of inductance is required because of the relatively equal spacing on the assigned bands. However, when moving from channel 7 to channel 6, it is necessary that a relatively large lump inductance be introduced in order to change the frequency to the required 75 megacycles. This is accomplished by introducing into the printed circuit on the face of the plate 10 an inductance coil 50, shown more clearly in Figures 1 and 2 and in phantom Figure 3. The inductance coil 50 is connected between conductors 51 and 52.

When the disc 10 is rotated counter-clockwise to a position where the contact finger 30 is in contact with the conductor 52 at 52*a*, the contact finger 29 is in contact with a segment 53 so that the inductive path is from the segment 53 through the conductor 51, inductance 50, conductor 52 to the point 52*a*.

As the disc 10 is rotated further counter-clockwise, the contact point 30 slides along the conductor 52 from the point 52*a* to a point 52*b*, and the contact element 29 makes progressive contact with segments 54, 55, 56 and 57.

Each of the segments 53 to 57, inclusive, are connected in series by means of conductors 58 to 61, inclusive, so that as the contact points 29 and 30 progress around the disc 10, the total length of path for the current to flow between the two contacts is progressively increased to thereby change the channel from channel 6 to channel 2.

In Figure 5 I have illustrated a tuning disc designated generally 10*a* which contains the same essential features embodying the principles of my invention as illustrated in Figure 3, but modified in showing a different pattern of conductive paths. I have illustrated in this modification, contact segments 65 and 66 joined by inductive conductor 67 which is used to select channel 13. Conductive segments 68 and 69 are connected by means of conductor 70 and rotation of the disc 10*a* clockwise past the contact points 29 and 30 causes the contacts 29 and 30 to slide along the segments 68 and 69 in a counter-clockwise direction to progressively change the inductive value thereof to select from channel 12 to channel 7.

Upon further rotation of the disc 10*a* clockwise, the contacts 29 and 30 are moved into contact with segments 72 and 73 at position A on 73. The conductive path interconnected between the contacts 29 and 30 therefore follows from segment 72 through conductors 75, 76 and 77 and segment 73 to point A.

Upon rotation of the disc so that the contact points 29 and 30 are in register with segments 79 and 73 at B, the conductive path is as follows: From segment 79 through conductor 80 to segment 72, conductors 75, 76 and 77, and segment 73 to point B.

Further movement of the disc causes the contacts 29 and 30 to engage segment 81 and 73 at C. The conductive path, therefore, is from segment 81 through conductor 82 to segment 72, thence through conductors 75, 76 and 77 and the segment 73 to point C.

In order to further increase the inductance of the circuit, the disc 10*a* may be rotated so that the contacts 29 and 30 rest against segment 83 and 73 at D. A conductive path is therefore established from segment 83 through conductors 76 and 77 and segment 73 to point D.

Further rotation of the disc causes connection between segment 84 and 73 at E through the conductor 77 and segment 73.

Whereas I have illustrated two specific forms of the tuning elements 10, it should be understood that other patterns of conductive paths may be employed within the scope and spirit of my invention. What I consider one of the essential features of my invention is a plurality of concentrically ganged dielectric plates having conductive surfaces disposed thereon, each of which is designed to vary the inductance of the given circuit, and each of which has a pair of concentrically disposed circumferentially spaced contact segments interconnected by means of conductive paths of varying lengths.

It will be readily apparent that such method of producing a television tuner is inherently advantageous from numerous standpoints. The principal advantage lies in the simplicity, the ease of manufacturing and the high degree of accuracy obtainable with unskilled labor.

I contemplate manufacturing the individual tuning discs by a well known photographic process, which involves making an accurate drawing of the circuit, photographing the circuit, developing the photograph on a dielectric plate having a sensitized emulsion surface, dissolving portions of the emulsion not wanted, and electroplating over the balance to build up the conductive surface.

It is readily apparent that such process can be carried on by photographing and developing a large number of circuits on a single sheet of material, electroplating all circuits at one time, and by a simple stamping operation, separating the individual tuning discs. The discs can, in this manner, be produced in substantially large numbers at relatively little expense.

By employing the discs in a structure similar to that illustrated in Figure 1, particularly in using the locating pins 14, the individual discs may be ganged in the proper position relatively rapidly with the use of unskilled labor.

Figure 6:
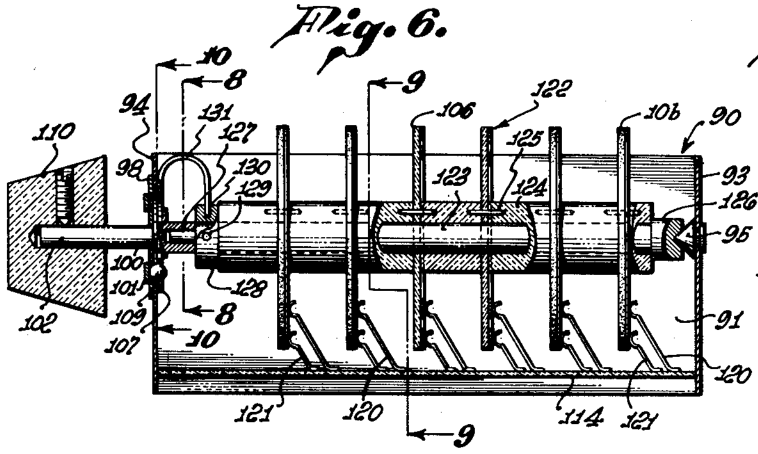
Figure 6 is a sectional elevation of a modified form of a television tuner embodying the principles of my invention.
Figure 7:
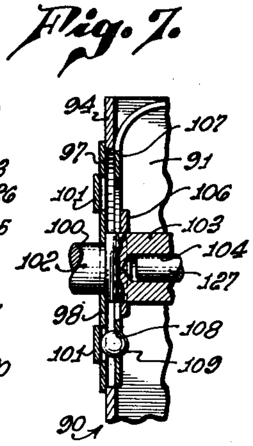
Figure 7 is a fragmentary side sectional elevation of the left-hand end of the tuner shown in Figure 6.

Referring to Figure 6, I have illustrated a modified form of a television tuner embodying the principles of my invention and comprising a box-like frame designated generally 90, having sides 91 and 92 and ends 93 and 94. The box-like structure is open at the top and bottom. A pivot point 95 is secured to the end 93.

The end 94 is formed with an aperture 97 which said aperture is covered by a plate 98. The plate 98 is secured to the end 94 by means of rivets 99 or other suitable securing means.

The plate at 98 is formed with a centrally disposed aperture 100 and a plurality of indentations 101, the indentations 101 being circumferentially spaced concentric with the aperture 100. A shaft 102 is disposed through the aperture 100 and is formed with an enlarged non-circular end 103 and has an axial bore 104 formed in said end.

A torque plate 106 is disposed over the square section 103 of the shaft 102 and is driven by rotation of the shaft 102. The torque plate 106 has secured thereto a spring plate 107 for common rotary motion. The spring plate 107 is formed with an aperture 108 adapted to receive a ball 109, the ball being larger in diameter than the aperture 108 so that it cannot pass therethrough. The spring plate 107 urges the ball 109 into the recess formed by the depressions 101. Rotation of the shaft 102 by means of a knob 110 causes rotation of the spring plate 107 and the ball 109 from one depression 101 to the next succeeding one to thereby act as a detent mechanism for establishing the rotary position of the shaft 102 and the spring plate 107. As will become apparent from a further description of the structure, it is essential to have one detent position for each channel on the television band.

The side 91 is formed with a slot 112 through which extends an ear 113 of a dielectric plate 114.

The side 92 is formed with a plurality of inwardly turned ears 115 above each of which is an aperture 116 in spaced relation therefrom. The plate 114 is inserted into the box-like structure diagonally until the ear 113 extends outwardly through the slot 112 and then rotated counter-clockwise until the other edge rests on the ear 115. The side at 92 is then staked inwardly as at 117 to thereby secure the plate 114 in position. The plate 114 serves the purpose of making the necessary connections between wiping contacts 120 and 121 and the balance of the television circuit.

A plurality of inductance component discs 122 are ganged in concentric relation on a shaft 123 and are spaced by means of dielectric spacers 124. Pins 125 are disposed through the disc 122 into corresponding holes in each of the spacers 124 to thereby properly position the discs with respect to each other.

The shaft 123 is formed with an enlarged end 126 having a hole in the end thereof adapted to fit over the pivot point 95 to thereby locate the shaft 123 and to provide for free rotation.

The other end of the shaft 123 is formed with a reduced end 127 adapted to fit in the bore 104, it being understood that the bore 104 is concentic with the pivot point 95.

A collar 128 is disposed over the shaft 123 to hold the ganged assembly in assembled relation and is secured thereto by means of a pin 129.

The collar 128 is formed with a slot 130. The spring plate 107 is formed with a U-shaped arm 131 having its outer end disposed in the slot 130. The arm 131 acts both as a driving coupling between the detent mechanism previously described and the ganged disc assembly, and also urges the ganged disc assembly to the right to thereby assure an adequate contact for the wiping contacts 120 and 121.

It will be understood that the discs 122 may assume any of the forms illustrated in Figures 3, 5, or 9. The circuit of the discs illustrated in Figures 3 and 5. has previously been described.

Referring to the disc 122 as illustrated in Figure 9, it comprises a dielectric plate 10b having conductive paths secured to the surface thereof by such means as heretofore described, that is, by a photographic process or by a silk screen process.

The dielectric plate 10b is formed with electrical conductive paths on the surface thereof, which are adapted to contact the wiping contacts 120 and 121 to thereby provide a path of increasing length as the plate 10b is rotated.

In this particular modification the conductive path comprises a contact segment 140 and a contact segment 141 joined at one end to define one continuous conductive path having concentric segments. "When the disc is in a rotary position so that the contact points 120 and 121 are in contact therewith adjacent the point of juncture between the two segments 140 and 141, the path will be relatively short and the disc will be tuned to channel 13.

As the disc is rotated counter-clockwise, the selected channel changes from 13 to 7 because of the gradual increase in the length of the path.

In moving from channel 7 to channel 6 as was previously explained, a relatively large lump inductance must be introduced into the circuit. This is accomplished by separating the segments 140 and 141 from the balance of the circuit, and by forming the path so that when the contact 121 rests on an arcuate segment 142 at point A and the contact 120 rests on a contact segment 143, the path for the current to follow will be from the segment 142 at point A through conductor 144, which forms two complete loops around the disc and returns to the segment 143.

Upon further rotation of the disc whereby the contact 121 rests on point B of the segment 142 and the contact 120 rests on a segment 145, the circuit will be in resonance with channel 5 and the path of current will be from point B to point A, through the conductor 144 and continuing past the segment 143 to conductor 147, thence through conductor 148 to the segment 145.

Further rotation of the disc 122 causes the contacts 120 and 121 to rest on segments 150, and 142 at point C, respectively. The path for the current is therefore from point C to point A through the conductor 144, conductor 147, conductor 151, making two complete loops, and thence to segment 150. This position makes the circuit resonant with channel 4.

In order to render the circuit resonant with channel 3, the disc is further rotated so that the contacts 120 and 121 rest against segment 153 and 142 at point D, respectively. The inductance path is therefore from point D to point A, through the conductor 144, conductor 155, conductor 156 to the segment 153.

Again upon further rotation of the disc so that the contacts 120 and 121 rest on segment 157, and 142 at point E, the following path is established: From point E to A, conductor 144, conductor 155, through the double loop of conductor 152 to the segment 157.

Whereas I have shown three different modifications of circuits which may be used in connection on the surface of the respective discs, and two modifications of a mechanical means for ganging the discs, it will be understood that any one of the discs may be used in connection with either of the modifications of the assembled tuner, depending upon the requirements of the particular circuit.

The form of contact illustrated in Figure 12 differs from the contacts shown in Figures 1 and 6 by embodying a return loop. A horizontal base 205 may be riveted to dielectric plate 28. A substantially vertical leg 206 is looped over at the top 207 and continues in the form of a return leg 208, the lower end of which is bent under to form part of the base 205. Obviously, spring material is employed, and the legs may be formed with slots 209 to increase the resiliency but at the same time afford a relatively broad loop whereby a dimple 210 may be struck outwardly to provide a ball-type contact with the disc.

While I have herein shown and described my invention in what I have conceived to be the most practical and preferred embodiment, it is recognized that departures may be made therefrom within the scope of my invention, which is not to be limited to the details disclosed herein, but is to be accorded the full scope of the claims so as to embrace any and all equivalent devices.

Having thus described my invention, what I claim as new and desire to secure by Letters Patent is:

1. Means for varying the inductive reactance of an electrical circuit comprising a rotatable support carrying a plurality of contact segments arranged in a pair of concentric circles and being in circumferentially spaced relation, inductive elements interconnecting said contact segments on one circle with the segments on the other circle, said elements being of predetermined values, and a pair of stationary contacts conductively connected to said electrical circuit and adapted to successively contact pairs of interconnected segments to thereby connect varying inductances into said circuit.

2. Means for simultaneously varying the inductive reactance of a plurality of electrical circuits, the means for varying the inductive reactance of each circuit comprising a rotatable support carrying a plurality of contact segments arranged in a pair of concentric circles and in circumferentially spaced relation, inductive elements interconnecting said contact segments on one circle with the segments on the other circle, said elements being of predetermined values, and a pair of stationary contacts conductively connected to said electrical circuit and adapted to successively contact pairs of interconnected segments to thereby connect varying inductances into said circuit, the rotatable contact segments of each circuit being simultaneously rotatable in response to a single control.

3. Means for varying the inductive reactance of a high frequency electrical circuit comprising a rotatable dielectric disc, said disc being formed with conductive surfaces defining a plurality of substantially concentric inductive loops, and means for selectively connecting different loops of different inductive values into said electrical circuit, said last means comprising a pair of stationary contacts adapted to slidably engage spaced portions of successive inductive loops upon rotation of said disc and being connected into said electrical circuit.

4. Means for varying the inductive reactance of an electrical circuit comprising a rotatable dielectric disc having inductive paths on at least one surface thereof and a plurality of pairs of contact segments conductively connected to said inductive paths at predetermined spaced intervals, a pair of stationary contacts adapted to successively engage successive pairs of said contact segments upon rotation of said disc to thereby connect varying portions of said inductive path into said electrical circuit to thereby vary the inductance thereof.

5. Means for simultaneously varying the inductive reactance of a plurality of high frequency electrical circuits comprising a plurality of rotatable dielectric discs in spaced parallel concentric relation, each of said discs having metallic surfaces defining conductive paths of varying inductive reactances, and a pair of stationary contacts disposed adjacent each disc to engage, in sliding conducting relation, incrementally spaced portions of the conductive paths of each of said discs upon rotation thereof and each pair of said contacts being electrically connected into one of said electrical circuits whereby the inductance of said circuit is varied upon rotation of said discs.

6. In a television tuner, a box-like frame having end walls, a plurality of dielectric discs in spaced parallel coaxial relation rotatably mounted in said frame, a dielectric spacer between each contiguous disc, keying means for interlocking contiguous spacers and intervening disc against relative rotation, a pair of stationary contacts mounted on said frame adjacent each disc and being connected to component parts of a television circuit, each of said discs being formed with inductive paths on the surface thereof adapted to be conductively coupled to each respective pair of contacts upon rotation of said discs whereby upon rotation of said discs the inductance of each said circuit component is changed, and detent means for selectively positioning said discs upon rotation.

7. In a television tuner, a box-like frame having end walls, a plurality of dielectric discs in spaced parallel coaxial relation rotatably mounted in said frame between said end walls, a dielectric plate supported in said frame, and a pair of stationary contacts mounted on said dielectric plate adjacent each disc and being connected to component parts of a television circuit, each of said discs being formed with disconnected inductive paths on the surface thereof adapted to be successively conductively coupled to said respective adjacent stationary contacts upon rotation of said discs whereby upon rotation of said discs the inductance of each said circuit component is changed.

8. In a high frequency tuner, a box-like frame having end walls, a plurality of dielectric discs in spaced parallel coaxial relation rotatably mounted in said frame between said end walls, a dielectric plate supported in said frame, metallic surfaces defining conductive paths on said dielectric plate forming parts of a high frequency circuit, a pair of stationary contacts mounted on said dielectric plate adjacent each disc and connected to certain of said metallic surfaces comprising a circuit component, each of said discs being formed with inductive paths on the surface thereof and adapted to be conductively coupled to said respective adjacent stationary contacts whereby upon rotation of said discs the inductance of each circuit component is changed.

9. In a television tuner, a rotatable disc of dielectric material, said disc having metallic surfaces thereon defining a plurality of conductive paths of different inductive reactances, stationary contact means adjacent said disc adapted to successively engage said surfaces and connect the same to an external high frequency circuit, a separate conductor of relatively high inductive reactance carried by said disc, and means connecting said conductor in series with a plurality of said paths, less than the total number of said paths on said disc.

10. A device as set forth in claim 9 wherein said last-named plurality of said paths is so arranged that the individual paths of said plurality are successively engaged by said stationary contact means during continued rotation of said disc in the same direction.

11. In a high frequency inductance tuner for television circuits designed to be tuned selectively for a group of relatively low frequency channels and a group of relatively high frequency channels, a rotatably mounted disc element having conductive surfaces defining inductive paths of various values on one surface thereof, stationary contact means adjacent said disc element adapted to have said inductive paths of various values selectively engaged thereby upon rotation of said disc element to connect the said inductive paths to a high frequency circuit, one of said inductive paths being concentrically disposed with respect to the axis of said rotatable disc element whereby successive steps in the rotation thereof will adjust said tuner selectively to correspond to the channels of said group of relatively high frequency channels by changing the length of the said concentrically disposed inductive path in circuit with said high frequency circuit, the others of said inductive paths having different inductive reactances, said stationary contacts being also adapted to successively engage said other of said inductive paths to adjust said tuner selectively to correspond to the channels of said group of relatively low frequency channels.

12. In a high frequency inductance tuner for television circuits designed to be tuned selectively for a group of relatively low frequency channels and a group of relatively high frequency channels, a rotatably mounted disc element having conductive surfaces defining inductive paths of various values on one surface thereof, stationary contact means adjacent said disc element adapted to have said inductive paths of various values selectively engaged thereby upon rotation of said disc element to connect the said inductive paths to a high frequency circuit, one of said inductive paths being concentrically disposed with respect to the axis of said rotatable disc element whereby successive steps in the rotation thereof will adjust said tuner selectively to correspond to the channels of said group of relatively high frequency channels by changing the length of the said concentrically disposed inductive path in circuit with said high frequency circuit, the others of said inductive paths having different inductive reactances, said stationary contacts being also adapted to successively engage said other of said inductive paths to adjust said tuner selectively to correspond to the channels of said group of relatively low frequency channels, and a lump inductance having a magnitude greater than any one of said concentrically disposed or said other inductive paths carried by said disc element and adapted to be connected in series with said other inductive paths when the latter are connected to said high frequency circuit.

EDWIN P. THIAS.

REFERENCES CITED

The following references are of record in the file of this patent:

UNITED STATES PATENTS

| Number | Name | Date |
|---|---|---|
| 1,975,247 | Andres et al. | Oct. 2, 1934 |
| 2,062,253 | Walker et al. | Nov. 24, 1936 |
| 2,423,152 | Mitchell | July 1, 1947 |
| 2,496,183 | Thias et al. | Jan. 31, 1950 |
| 2,503,582 | Ginsburg | Apr. 11, 1950 |